United States Patent
Yu

(10) Patent No.: US 7,491,049 B2
(45) Date of Patent: Feb. 17, 2009

(54) APPARATUS FOR HOT EMBOSSING LITHOGRAPHY

(75) Inventor: Tai-Cherng Yu, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 354 days.

(21) Appl. No.: 11/433,243

(22) Filed: May 12, 2006

(65) Prior Publication Data

US 2007/0077325 A1 Apr. 5, 2007

Related U.S. Application Data

(63) Continuation of application No. 11/240,199, filed on Sep. 30, 2005.

(51) Int. Cl.
*B32B 37/02* (2006.01)
*B29C 41/12* (2006.01)

(52) U.S. Cl. .............. 425/174.4; 425/385; 425/403

(58) Field of Classification Search ......... 425/174.4, 425/385, 403, 406; 249/115, 118
See application file for complete search history.

(56) References Cited

U.S. PATENT DOCUMENTS

| 5,772,905 | A | 6/1998 | Chou | |
|---|---|---|---|---|
| 6,325,610 | B2 * | 12/2001 | Chiu et al. | 425/174.4 |
| 6,696,220 | B2 * | 2/2004 | Bailey et al. | 425/385 |
| 6,780,001 | B2 * | 8/2004 | Eldridge et al. | 425/385 |
| 7,137,803 | B2 * | 11/2006 | Chou | 425/405.1 |
| 7,179,079 | B2 * | 2/2007 | Sreenivasan et al. | 425/385 |

* cited by examiner

*Primary Examiner*—Yogendra Gupta
*Assistant Examiner*—Thu Khanh T Nguyen
(74) *Attorney, Agent, or Firm*—Andrew C. Cheng

(57) ABSTRACT

An apparatus for hot embossing lithography includes a press mold (20), a substrate (10), a first heating device (40), a second heating device (40'), and a vacuum chamber (32). The press mold has a main body (21) and a number of relief structures (22) extending therefrom. The substrate (10') is configured for holding a polymer thin film (30) to be pressed. The first heating device (40) is adapted for heating the press mold, while the second heating device (40') is adapted for heating the polymer thin film on the substrate. The vacuum chamber (32) has an opening (33) through which a vapor (34) can be introduced into the chamber, in order to lower a surface energy of the press mold. The press mold and the substrate are accommodated in the vacuum chamber, and the press mold is aligned with the polymer thin film on the substrate.

14 Claims, 3 Drawing Sheets

APPARATUS FOR HOT EMBOSSING LITHOGRAPHY

CROSS-REFERENCE TO RELATED APPLICATIONS

This application is a continuation application of U.S. patent application Ser. No. 11/240,199, filed on Sep. 30, 2005, currently co-pending herewith, the content of which is hereby incorporated by reference thereto.

BACKGROUND OF THE INVENTION

1. Field of the Invention

The invention relates generally to lithography apparatus for fabrication integrated circuits and micro-devices and, more particularly, to nanoimprint lithography apparatus for forming, e.g., integrated circuits or ultra fine nanostructures on polymer thin films carried on a substrate.

2. Discussion of the Related Art

Nanoimprint lithography methods are newly developed lithography methods for fabrication of nanostructures with high-resolution, high-throughput and low-cost. The methods are based on an excellent replication fidelity obtained with polymers and combines thermo-plastic molding with common pattern transfer methods. Once a solid stamp (press mold) with a nanorelief on a surface thereof is fabricated, the solid stamp can be used for replication of many identical surface patterns. Therefore, the nanoimprint lithography methods can eliminate many limitations imposed upon conventional optical lithography, such as wavelength limitation, backscattering of particles in the resist and/or the substrate, and interferences. The nanoimprint lithography methods have potential application in the fabrication of, for example, micro electronic/mechanical systems, compact disk storage and magnetic storage systems, opto-electrical and optical devices, biological chips and microfluidic devices.

Hot embossing lithography method, which was proposed by Stephen Y. Chou in 1995, is an important nanoimprint lithography method. The hot embossing lithography method is typically based on pressing a mold into a thin film carried on a substrate to form a relief and then removing the compressed area of the thin film to expose the underlying substrate that replicates an obverse of a protruding pattern of the mold.

Referring to FIGS. 1A to 1D, a typical conventional hot embossing lithography method is shown. First, a mold 200 and a polymer thin film 300 formed on a substrate 100' are provided. The mold 200 includes a main body 201, a number of relief features 202 having a desired shape and a number of recesses (not labeled), each recess being defined between a neighboring pair of relief features 202. The polymer thin film 300 can be deposited or coated on the substrate 100' by any appropriate method, for example spin coating. Generally, the polymer thin film 300 includes a thermoplastic polymer, such as polymethyl methacrylate (PMMA). PMMA has a glass transition temperature about 105 degrees Celsius. When PMMA is heated to a temperature above the glass transition temperature thereof, PMMA is softened, has a low viscosity, and can flow.

The mold 200 can be patterned with the relief features 202 and the recesses with a lateral feature size of less than 25 nanometers. Such relief features 202 and recesses can be created, for example, by electron beam lithography, reactive ion etching (RIE) and/or other appropriate methods. In general, the mold is selected to be hard relative to the softened polymer thin film. The mold can be made of, e.g., metals, dielectrics, semiconductors, ceramics, or combinations thereof. Second, the mold 200 and the polymer thin film 300 carried on the substrate 100' are placed in a vacuum chamber (not shown), and the mold 200 is aligning with the polymer thin film 300. Third, the mold 200 and the polymer thin film 300 are heated by a heater 400 to a temperature above the glass transition temperature of the polymer thin film 300. The mold 200 is pressed into the softened polymer thin film 300. As a result, the pattern of the relief features of the mold 200 are transferred to the polymer thin film 300, and a pattern conforming to the pattern of the mold 200 is formed on the polymer thin film 300. Fourth, the mold 200 and the polymer thin film 300 are cooled down, and the mold 200 is separated from the polymer thin film 300.

However, (1) the mold 200 is apt to be adhered to the polymer thin film 300 because of a strong adsorption force between the mold 200 and the polymer thin film 300. (2) Due to a difference in thermal conductivity of the materials, the mold 200 tends to cool down faster than the polymer thin film 300. Thus, the relief features 202 are liable to be jammed with the pattern formed on the polymer thin film 300. These phenomena will damage the pattern formed on the polymer thin film and, therefore, reduce a precision of the pattern on the polymer thin film or even destroy the pattern.

Solutions to solve the above problem have been proposed. For example, it is suggested to form a surface treated layer on a press surface of the mold 200 to reduce an adhesive force between the mold 200 and the polymer thin film 300. However, the sizes of the relief features on the press surface of the mold 200 are very small (less than 25 nanometers). Therefore, it is difficult to form an additional thin layer on the press surface, if even possible. Likewise, it is difficult to maintain a precise depth or width of the relief features on the press surface due to the additional thin layer. Furthermore, the surface treated layer is liable to release from the press surface during operation. Therefore, this solution is hard to practice, and the cost is expensive.

Therefore, what is needed is an apparatus for hot embossing lithography that is easy to operate, is relatively inexpensive, and has a high precision for pattern transformation.

SUMMARY

In a preferred embodiment, an apparatus for hot embossing lithography includes a press mold having a main body and a number of relief structures extending from the main body, a substrate configured for holding/carrying a polymer thin film to be pressed, a first heating device adapted for heating the press mold, a second heating device adapted for heating the polymer thin film on the substrate, and a vacuum chamber having an opening for introducing a vapor into the chamber to lower a surface energy of the press mold. The press mold and the substrate are accommodated in the vacuum chamber, and the press mold is aligned with the polymer thin film on the substrate.

Preferably, the press mold is hard relative to the polymer thin film.

Preferably, the vapor includes at least one of water vapor and alcohol vapor.

Preferably, each of the relief structures includes at least one chamfer, each chamfer is formed at one distal end of the corresponding relief structure, opposite to the main body of the press mold.

More preferably, each of the relief structure has a lateral side, each chamfer defines an angle of about 3~5 degree with respect to the corresponding lateral side of the relief structure.

Preferably, the press mold is made of a material selected from group consisting of metals, dielectrics, semiconductors, thermoplastics, ceramics, and composites.

For example, the press mold is comprised of at least material chosen from the group consisting of nickel, silicon, silicon dioxide, silicon nitride, silicon carbide, and fluorinated siloxane copolymer.

Preferably, the relief structures of the press mold have a lateral size less than 100 nanometers.

More preferably, the relief structures of the press mold have a lateral size less than 25 nanometers.

The present apparatus can be used for a hot embossing lithography process for treating a polymer thin film, such as PMMA, by pressing the press mold having a desired pattern, therefore, the pattern of the press mold is transferred to the polymer thin film.

Compared with a conventional technology, the present apparatus for a hot embossing lithography of any of the described embodiments has the following advantages. Firstly, the vacuum chamber has an opening, therefore, a vapor can be introduced and a surface absorption energy of the press mold is accordingly lowered, allowing the press mold to easily separate from the polymer thin film. Secondly, the vapor used in the method is inexpensive. Thirdly, the present invention ensures precise transformation of the pattern on the press mold to the polymer thin film without damage to the polymer thin film.

Other advantages and novel features will become more apparent from the following detailed description of preferred embodiments when taken in conjunction with the accompanying drawings.

BRIEF DESCRIPTION OF THE DRAWINGS

Many aspects of the present apparatus for hot embossing lithography can be better understood with reference to the following drawings. The components in the drawings are not necessarily to scale, the emphasis instead being placed upon clearly illustrating the principles of the present apparatus. Moreover, in the drawings, like reference numerals designate corresponding parts throughout the several views.

Figure 1A:
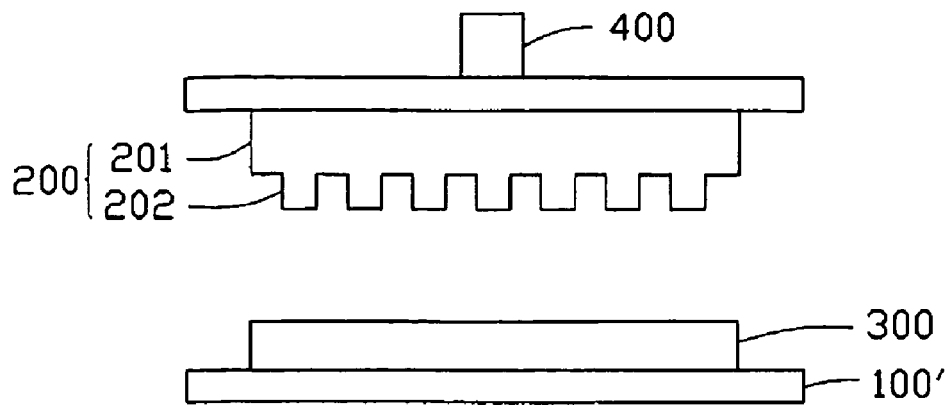
FIG. 1A is a schematic, frontal view of a conventional hot embossing lithography method, showing a mold and a polymer thin film carried on a substrate.
Figure 1B:
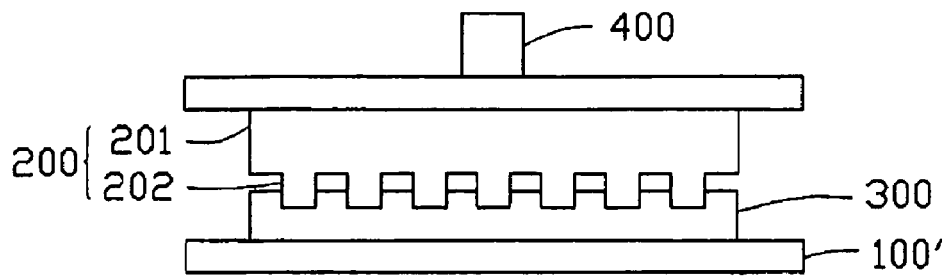
FIG. 1B is similar to FIG. 1A, but showing the mold being aligned with and partly pressed into the polymer thin film.
Figure 1C:
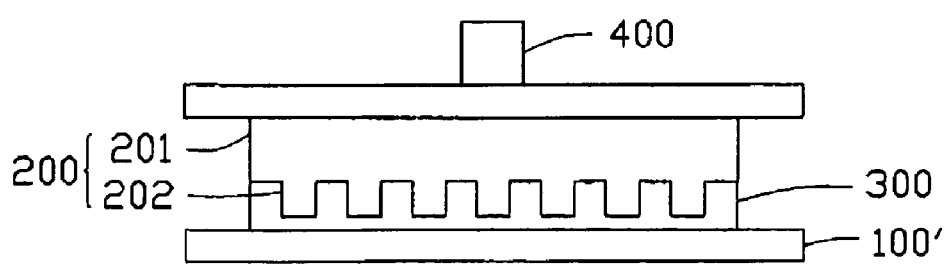
FIG. 1C is similar to FIG 1B, but showing the mold being fully pressed into the polymer thin film.
Figure 1D:
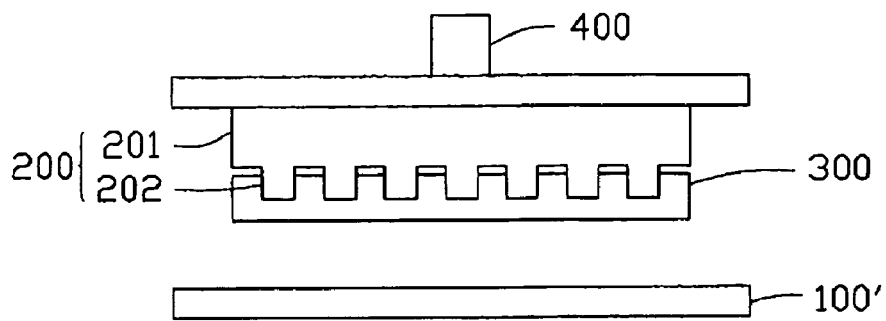
FIG. 1D is similar to FIG. 1C, but showing the mold being adhered to the polymer thin film after cooling down.

Corresponding reference characters indicate corresponding parts throughout the several views. The exemplifications set out herein illustrate at least one preferred embodiment of the invention, in one form, and such exemplifications are not to be construed as limiting the scope of the invention in any manner.

DETAILED DESCRIPTION OF PREFERRED EMBODIMENTS

Reference will now be made to the drawings to describe preferred embodiments of the present hot embossing lithography method, in detail.

Referring to FIGS. 2A to 2D, a hot embossing lithography method according to a first preferred embodiment is shown. First, a press mold 20 and a substrate 10' having a polymer thin film 30 formed thereon are provided. The press mold 20 includes a main body 21 and a press surface 21a. The press surface 21a defines a pattern containing a number of relief structures 22 having a desired shape. Every two neighboring relief structures 22 define a recess 22a therebetween. Generally, the relief structures 22 and the recesses 22a each have a lateral size of about 100 nanometers or less, preferably less than 25 nanometers.

The polymer thin film 30 can be deposited or coated on the substrate 10' by any appropriate method, for example, spin coating. Preferably, the polymer thin film 30 includes a thermoplastic polymer, such as polymethyl methacrylate (PMMA), polycarbonate, polystyrene, Shipley 8000 (produced by Shipley), SU8, MR-I8000, and/or MR-I9000 (produced by Micro Resist Technology GmbH). For example, PMMA has glass transition temperature ($T_g$) of about 105 degrees Celsius. When PMMA is heated to a temperature above $T_g$, PMMA is softened, has a low viscosity, and is flowable. Generally, the press mold 20 is selected to be hard relative to the softened polymer thin film 30. Advantageously, the press mold 20 can be made of a material chosen from the group consisting of metals, dielectrics, semiconductors, ceramics, thermoplastics, and composite materials. For example, the press mold 20 can be made, more particularly, of a material selected from group consisting of nickel, silicon, silicon dioxide, silicon nitride, silicon carbide, and fluorinated siloxane copolymer, or of some combination of such materials. Preferably, the mold has a high Knoop hardness, high compression strength, high tensile strength, high thermal conductivity, low thermal expansion coefficient, and good resistance to corrosion.

Second, the press mold 20 and the polymer thin film 30 carried on the substrate 10' are together placed in a vacuum chamber 32 (schematically indicated in FIGS. 2A and 2B only), and the press mold 20 is aligned with the polymer thin film 30. The vacuum chamber 32 defines an opening 33 therein.

Figure 2A:
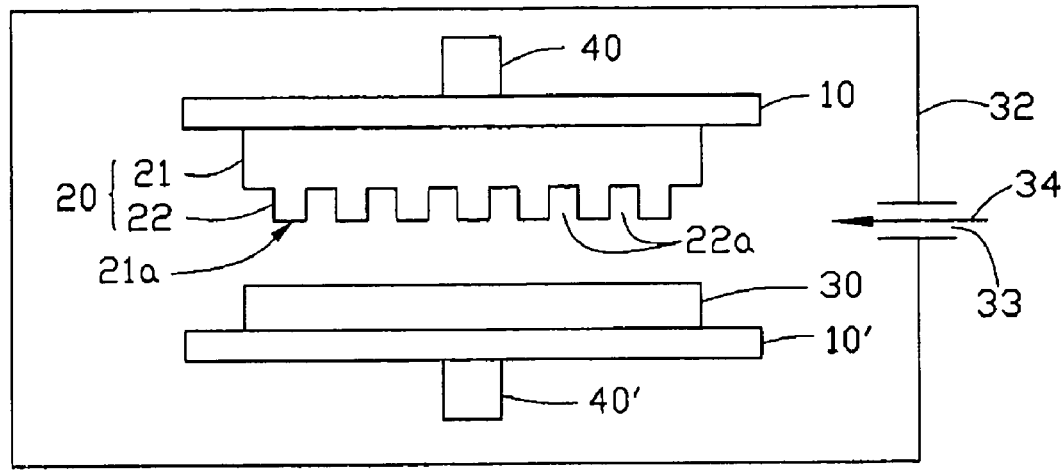
FIG. 2A is a schematic, frontal view of a hot embossing lithography method according to a first preferred embodiment of the present method, showing a mold and a polymer thin film.
Figure 2B:
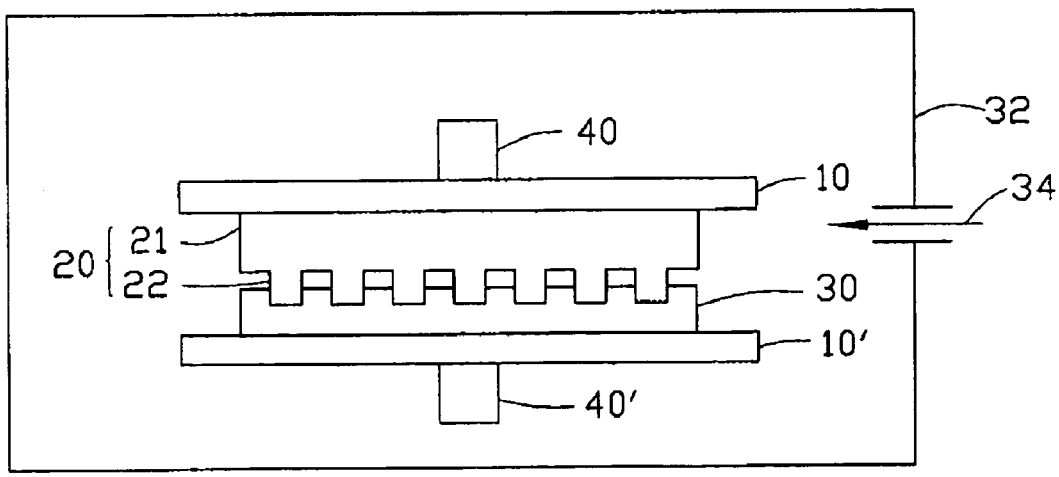
FIG. 2B is similar to FIG. 2A, but showing the mold being aligned with and partly pressed into the polymer thin film.
Figure 2C:
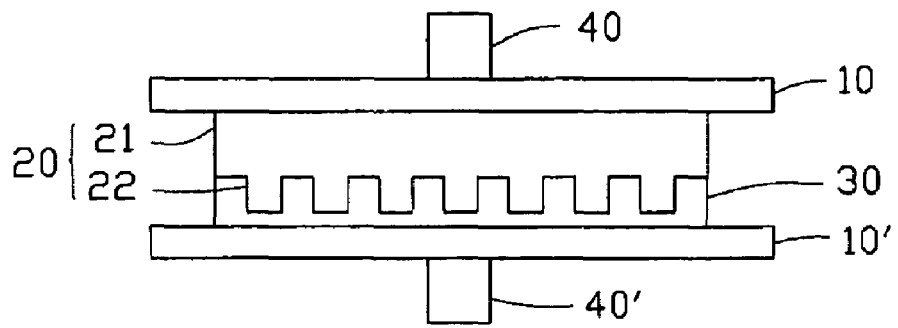
FIG. 2C is similar to FIG. 2B, but showing the mold being fully pressed into the polymer thin film.
Figure 2D:
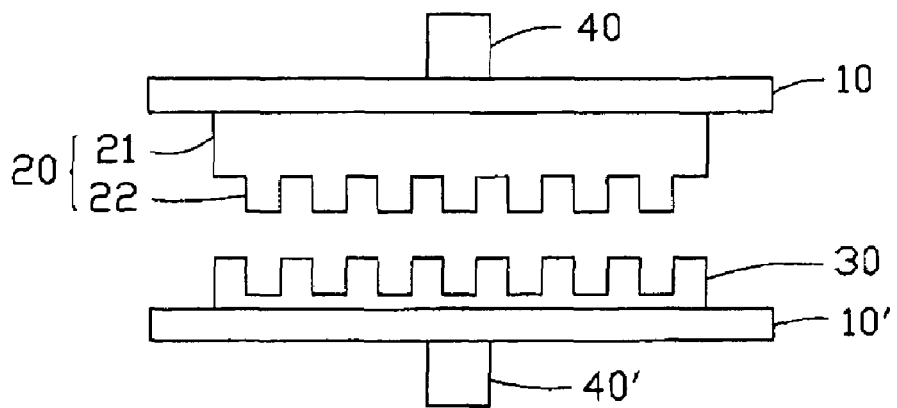
FIG. 2D is similar to FIG. 2C, but showing the mold being separated and released from the polymer thin film.

Third, a vapor 34 (the flow/source of which is schematically indicated by an arrow in FIGS. 2A and 2B) is introduced into the vacuum chamber 32 through the opening 33. Thus, the vapor 34 is dispersed to the press surface 21a of the press mold 20, and the press surface 21a is moistened. Therefore, a surface adsorption energy of the press surface 21a is lowered, thereby facilitating the subsequent separation and removal of the press mold 20 from the polymer thin film 30. Preferably, the vapor 34 has a low molecular weight, such as less than 100. Advantageously, the vapor is selected from water vapor and alcohol vapor (or a combination of such vapors).

Fourth, the press mold 20 and the polymer thin film 30 are heated by heating devices 40 and 40' to a temperature above the glass transition temperature of the polymer thin film 30. Preferably, the press mold 20 and the polymer thin film 30 are heated to a temperature about 50~100 degrees Celsius above the glass transition temperature of the polymer thin film 30.

Therefore, the polymer thin film 30 is softened. Then, a pressure is applied between a top plate 10 and the substrate 10', causing the press mold 20 to be pressed into the softened polymer thin film 30. Preferably, the pressure applied between the top plate 10 and the substrate 10' is approximately 40~100 bars. Thus, the pattern of the press mold 20 is transferred to the polymer thin film 30, and a second pattern conforming to the pattern of the press mold 20 is formed on the polymer thin film 30.

Fifth, the press mold 20 and the polymer thin film 30 are cooled down to a temperature near the glass transition temperature of the polymer thin film 30, and the press mold 20 is separated and removed from the polymer thin film 30. Preferably, the press mold 20 and the polymer thin film 30 are cooled down to a temperature about 10~30 degrees Celsius above or below the $T_g$ or essentially at $T_g$ (i.e., a temperature in a range approximately within 10 to 30° C. of $T_g$). Therefore, the pattern on the press mold 20 is successfully transferred to the polymer thin film 30, and the polymer thin film 30 is ready for subsequent process. Due to the lowered surface absorption energy of the press surface of the press mold 20, damage that often occurred in a conventional process can generally be avoided.

Figure 3:
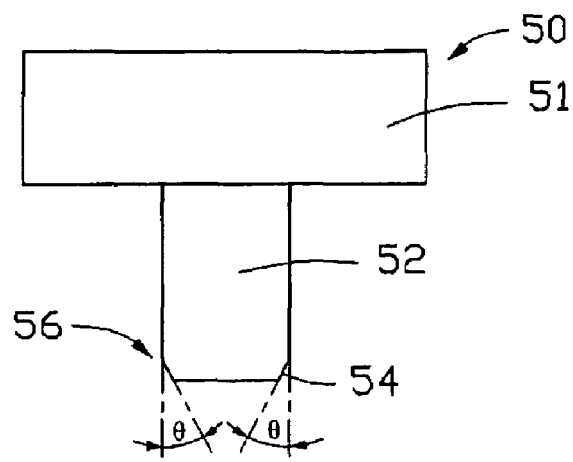
FIG. 3 is a schematic, frontal view of a relief structure of a press mold according to a second preferred embodiment of the present method.

Referring to FIG. 3, a press mold 50 according to a second embodiment of the present method is shown. This embodiment includes substantially same steps with the first embodiment but using a press mold 50 having chamfers 54, as shown in FIG. 3. The press mold 50 employed in the second embodiment is similar to the press mold 20 used in the first embodiment and includes a main body 51 and a number of relief structures 52 (only one is shown in FIG. 3) formed thereon. Each of the relief structures 52 forms two chamfers 54 at one distal end 56 of a given relief structure 52, opposite to the main body 52. Each of the chamfers 54 forms an angle about 3~5 degree with respect to a corresponding vertical side surface of the associated relief structure 52. The relief structures 52 with chamfers 54 at one end 56 facilitate separation and removal of the press mold 50 from the polymer thin film without significant changes on the configuration of the press mold 50.

Preferably, in the above described embodiments, the press mold 20 is cooled down slowly, and the polymer thin film 30 is cooled down faster than the press mold 20. In a conventional hot embossing lithography method, the press mold is generally cooled down faster than the polymer thin film due the inherent properties of the materials during the cooling down step. This differential cooling causes the press mold to shrink faster than the polymer thin film. Therefore, the press mold can be jammed in the polymer thin film and thus hindered from separation and removal from the polymer thin film. This problem can be solved by cooling down the press mold 20 slowly and, simultaneously, cooling down the polymer thin film 30 faster by controlling the heating devices 40 and 40', respectively. Thereby, the pattern formed in the polymer thin film 30 is shrunken faster than the pattern of the press mold 20. As a result, the press mold 20 is easier to separate and remove from the polymer thin film 30.

It is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. An apparatus for hot embossing lithography, comprising:
    a substrate structured and arrranged for holding a polymer thin film to be pressed;
    a press mold capable of being in alignment with the polymer thin film, the press mold comprising a main body and a plurality of relief structures extending from the main body, each relief structure having a pressing surface facing away from the main body, a side surface adjacent to the main body, and at least one planar chamfer, each chamfer having two opposite edges adjoining the pressing surface and the side surface respectively, the chamfers being configured for facilitating separation and removal of the press mold from the polymer thin film without significant chance to the configuration of the mess mold;
    a first heating device adapted for heating the press mold;
    a second heating device adapted for heating the polymer thin film on the substrate; and
    a vacuum chamber having an opening configured for introducing a vapor flow thereinto thereby moistening the pressing surfaces of the relief structures to lower a surface adsorption energy of the pressing surfaces, the press mold and the substrate being accommodated in the vacuum chamber.

2. The apparatus as claimed in claim 1, wherein the press mold is hard relative to the polymer thin film.

3. The apparatus as claimed in claim 1, further including a source of the vapor flow introduced into the vacuum chamber, the vapor flow comprising at least one of water vapor and alcohol vapor.

4. The apparatus as claimed in claim 1, wherein each chamfer defines an angle of about 3~5 degrees with respect to the corresponding side surface of the relief structure.

5. The apparatus as claimed in claim 1, wherein the press mold is made of a material selected from the group consisting of metals, dielectrics, semiconductors, thermoplastics, ceramics, and composites.

6. The apparatus as claimed in claim 5, wherein the press mold is comprised of at least one material chosen from the group consisting of nickel, silicon, silicon dioxide, silicon nitride, silicon carbide, and fluorinated siloxane copolymer.

7. The apparatus as claimed in claim 1, wherein the relief structures of the press mold have a lateral size of less than 100 nanometers.

8. The apparatus as claimed in claim 7, wherein the relief structures of the press mold have a lateral size of less than 25 nanometers.

9. A press mold for hot embossing lithography, comprising:
    a main body; and
    a plurality of relief structures extending from the main body, each relief structure having a pressing surface facing away from the main body, a side surface adjacent to the main body, and at least one planar chamfer, each chamfer having two opposite edges adjoining the pressing surface and the side surface respectively, the chamfers being configured for facilitating separation and removal of the press mold from an article pressed by the press mold without significant change to the configuration of the press mold.

10. The press mold as claimed in claim 9, wherein each chamfer defines an angle of about 3~5 degrees with respect to the corresponding side surface of the relief structure.

11. The press mold as claimed in claim 9, wherein the press mold is made of a material selected from the group consisting of metals, dielectrics, semiconductors, thermoplastics, ceramics, and composites.

12. The press mold as claimed in claim 11, wherein the press mold is comprised of at least material chosen from the group consisting of nickel, silicon, silicon dioxide, silicon nitride, silicon carbide, and fluorinated siloxane copolymer.

13. The press mold as claimed in claim 9, wherein the relief structures of the press mold have a lateral size of less than 100 nanometers.

14. The press mold as claimed in claim 13, wherein the relief structures of the press mold have a lateral size of less than 25 nanometers.

* * * * *